US008593305B1

(12) United States Patent
Tajalli et al.

(10) Patent No.: US 8,593,305 B1
(45) Date of Patent: Nov. 26, 2013

(54) EFFICIENT PROCESSING AND DETECTION OF BALANCED CODES

(75) Inventors: Armin Tajalli, Chavannes-près-Renens (CH); Harm Cronie, Lausanne (CH); Amin Shokrollahi, Préverenges (CH)

(73) Assignee: Kandou Labs, S.A. (CH)

( * ) Notice: Subject to any disclaimer, the term of this patent is extended or adjusted under 35 U.S.C. 154(b) by 0 days.

(21) Appl. No.: 13/542,599

(22) Filed: Jul. 5, 2012

Related U.S. Application Data

(60) Provisional application No. 61/504,676, filed on Jul. 5, 2011.

(51) Int. Cl.
*H03M 5/00* (2006.01)
(52) U.S. Cl.
USPC .............................................. 341/58; 714/776
(58) Field of Classification Search
USPC .............. 341/58, 95; 375/295, 296, 259, 134; 714/776, 18, 787, 755
See application file for complete search history.

(56) References Cited

U.S. PATENT DOCUMENTS

| | | | |
|---|---|---|---|
| 6,661,355 B2 * | 12/2003 | Cornelius et al. ................ | 341/58 |
| 2009/0185636 A1 | 7/2009 | Palotai et al. | |
| 2010/0205506 A1 | 8/2010 | Hara | |
| 2011/0268225 A1 | 11/2011 | Cronie et al. | |
| 2011/0302478 A1 | 12/2011 | Cronie et al. | |

FOREIGN PATENT DOCUMENTS

WO      2010/031824      3/2010

OTHER PUBLICATIONS

Abbasfar. A., "Generalized Differential Vector Signaling," *IEEE International Conference on Communications, ICC* '09 (Jun. 14, 2009), pp. 1-5.
Dasilva et al., "Multicarrier Orthogonal CDMA Signals for Quasi-Synchronous Communication Systems," *IEEE Journal on Selected Areas in communications*, vol. 12, No. 5 (Jun. 1, 1994), pp. 842-852.
Oh, et al. "Pseudo-Differential Vector Signaling for Noise Reduction in Single-Ended Signaling," [online] 2009 [retrieved on Jul. 24, 2012]. Retrieved from the Internet: < URL: http://www.rambus.com/assets/documents/events/090202_designcon_paper_oh.pdf>.
Slepian, D., "Permutation Modulation," *Proceedings of the IEEE*, vol. 53, No. 3 (1965), pp. 228-236.
Stan, et al. "Bus-Invert Coding for Low-Power I/O," *IEEE Transactions on VLSI Systems*, vol. 3, No. 1 (1995), pp. 49-50.
Tallini et al., "Transmission Time Analysis for the Parallel Asynchronous Communication Scheme," *IEEE Transactions on Computers*, vol. 52, No. 5 (2003), pp. 558-571.
Wang et al., "Applying CDMA Technique to Network-on-Chip," *IEEE Transactions on Very Large Scale Integration (VLSI) Systems*, vol. 15, No. 10 (Oct. 1, 2007), pp. 1091-1100.

* cited by examiner

*Primary Examiner* — Joseph Lauture
(74) *Attorney, Agent, or Firm* — Robert J. Irvine, III

(57) ABSTRACT

Circuits that are matched to balanced codes may recover transmitted information in a noise resilient and power efficient manner. Circuit components for processing a balanced code may include one or more of: matched amplification of the signals representing the balanced code, matched equalization and/or filtering on the signals representing the balanced code, matched non-linear filtering on the signaling representing the balanced code to detect the presence of particular symbols and matched latching of the signals representing the balanced code. Such matched circuits and circuit components may be achieved at least in part by incorporating suitable common circuit nodes and/or a single energy source into circuit topologies.

37 Claims, 13 Drawing Sheets

EFFICIENT PROCESSING AND DETECTION OF BALANCED CODES

CROSS-REFERENCE TO RELATED APPLICATIONS

This application claims the benefit of U.S. Provisional Application No. 61/504,676, entitled "Method and Circuits for Efficient Processing and Detection of Balanced Codes," filed on Jul. 5, 2011, which is herein incorporated by reference in its entirety.

The following references are additionally herein incorporated by reference in their entirety for all purposes:

- U.S. Patent Publication 2011/0268225 of application Ser. No. 12/784,414, filed May 20, 2010, naming Harm Cronie and Amin Shokrollahi, entitled "Orthogonal Differential Vector Signaling" (hereinafter "Cronie I");
- U.S. Patent Publication 2011/0302478 of application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II");
- U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III"); and
- U.S. patent application Ser. No. 13/464,849, filed on May 4, 2012, naming Harm Cronie and Amin Shokrollahi, entitled "Differential Vector Storage for Non-Volatile Memory" (hereinafter "Cronie IV").

FIELD OF THE INVENTION

The present invention relates to communications in general and in particular to transmission of signals capable of conveying information, wherein one or more of power consumption, pin-efficiency, SSO noise and common-mode noise are constraints.

BACKGROUND OF THE INVENTION

One goal of a communication system may be to transport information from one physical location to another. In some electronic communication systems, the communication itself takes place between electronic components. For example, these electronic components may be integrated circuits ("ICs") and this communication setting may be referred to as "chip-to-chip communication." The communicating electronic components might be located in the same apparatus, such as the communication between a central processing unit ("CPU") and memory inside a computer, tablet computing device, or other mobile device. Another example is the communication between two CPU cores that are integrated on the same chip. Yet another example is the communication between a Graphics Processing Unit ("GPU") and memory on a graphics card. In these cases, the actual communication can take place over wires on a printed circuit board ("PCB") and/or metal wires integrated in a chip and these wires carry electrical signals. It should be apparent upon reading this disclosure that other possibilities exist. The communication may, for instance, take place wirelessly or over an optical fiber.

In some cases, communication takes place between components that are located in different apparatuses. An example of this situation is a digital photo camera that is connected to a computer. In this setting, the communication can take place over a physical cable or wirelessly. Another example is a set of computers that are connected to a network. The electronic components on the network card of each computer may communicate with the electronic components of another network card of yet another computer.

In such communication settings, a goal may be to transmit digital information from one electronic component to another in a reliable and efficient way. The efficiency of the communication can be expressed in terms of the time it takes to transfer certain amount of information (speed), the energy that is required to transmit the information reliably (power consumption) and the number of wires per bit that is required for communication (pin-efficiency). Typically, several trade-offs exist between these parameters and, depending on the application, some of these parameters may be more important than others. One example is the communication between a CPU and a memory in a mobile device. A battery powers the mobile device and the power consumption of the communication between the CPU and memory can have a significant impact on the battery life. The desired trade-off may even change when the mobile device is connected to a non-portable power supply.

In some chip-to-chip communication systems communication takes place over a plurality of wires, for example, to increase the aggregate bandwidth. A single or pair of such wires may be referred to as a channel or link and multiple channels create a communication bus between the electronic components.

A difficulty in designing high speed, low power and pin-efficient chip-to-chip communication systems lies in part in the fact that the communication channel is not perfect. For example, the physical wires may disturb the signals transmitted on them and noise and interference may be added to the transmitted signals. As another example, the electronic components used to implement the communication system are not perfect and this can disturb the signals used for communication.

There can be multiple sources of noise in chip-to-chip communication systems. For example, there may be noise and interference that is common to a set of wires. This type of noise and interference is called common-mode noise. As another example, there may be thermal noise that is induced in electrical conductors. Thermal noise may be modeled as Gaussian noise that is added to each conductor independently. As yet another example, there may be simultaneous switching output ("SSO") noise that is caused by a time-varying current in the electronics that drive the wires. As still another example, the signals transmitted on different wires may interfere with one other, which can cause crosstalk and significantly degrade signal integrity, especially at high speeds. As still yet another example, for some signaling methods an absolute voltage or current reference is required at the receiver. Such references are difficult to maintain with great precision and errors in the reference may cause unwanted distortions and noise.

Conventional attempts to combat the various types of noise while optimizing pin-efficiency and power consumption are inefficient, ineffective and/or have undesirable side effects or other drawbacks with respect to at least one significant use case.

Embodiments of the invention are directed toward solving these and other problems individually and collectively.

BRIEF SUMMARY

Methods and circuits for efficient processing and/or detection of balanced codes are enabled. A set of controlled sources may be placed in a configuration with one or more common nodes. One or more current sources may sink a predetermined current from each of the common nodes. A code word of a balanced code may be provided as inputs to the set of controlled sources, and a result may be derived from the current provided by each controlled source and/or from a fraction of the predetermined current provided by each controlled source. Alternatively, the circuit nodes associated with each of the controlled sources may be interconnected with an impedance. The controlled sources and/or the impedances may be configured with respect to the balanced code input.

BRIEF DESCRIPTION OF THE DRAWINGS

Various embodiments in accordance with the present disclosure will be described with reference to the drawings, in which.

The attached figures provide examples that are further explained in the text below. Same numbers are used throughout the disclosure and figures to reference like components and features.

DETAILED DESCRIPTION OF EMBODIMENTS

Figure 1:
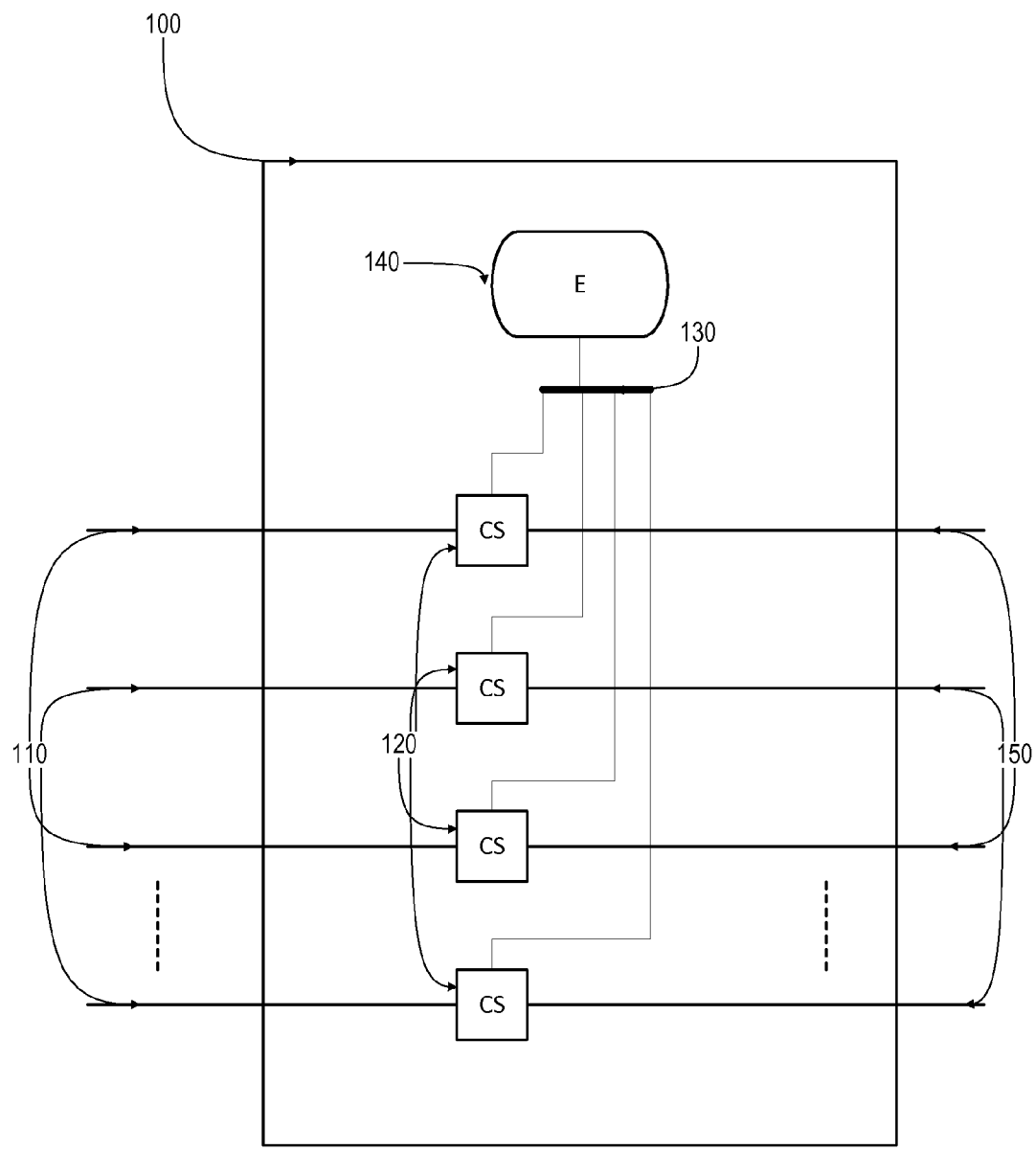
FIG. 1 is a schematic diagram depicting aspects of an example processing unit for a balanced code in accordance with at least one embodiment of the invention.

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

In accordance with at least one embodiment of the invention, methods and circuits for efficient processing and/or detection of balanced codes are enabled. Circuits that are matched to balanced codes may recover transmitted information in a noise resilient and power efficient manner. Circuit components for processing a balanced code may include one or more of: matched amplification of the signals representing the balanced code, matched equalization and/or filtering on the signals representing the balanced code, matched non-linear filtering on the signaling representing the balanced code to detect the presence of particular symbols and matched latching of the signals representing the balanced code. Such matched circuits and circuit components may be achieved at least in part by incorporating suitable common circuit nodes and/or a single energy source into circuit topologies.

In this disclosure the signaling methods disclosed in Cronie I, Cronie II and Cronie III are referred to as "balanced codes". Balanced codes operate on three or more bus wires. A balanced code of length n has the property that the corresponding n signals transmitted on the bus satisfy $$\sum_{i=0}^{n-1} s_i(t) = 0 \qquad \text{(Eqn. 1)}$$

In Equation 1, $s_i(t)$ denotes the signal present on the i-th bus wire. The signals may also sum to another predetermined number than 0 as is the case in Equation 1. In accordance with at least one embodiment of the invention, this predetermined number may be held constant for consecutive uses of the communication bus. Furthermore, after transmission across the wires of the bus, Equation 1 may only hold to a first approximation. Depending on the balanced code used, the signals transmitted on the wires of the bus may also satisfy additional constraints. For example, sparse signaling codes as introduced in Cronie II may result in a significant number of signals that are equal to 0. These additional properties may be used to implement power efficient receiver architectures as is shown in this disclosure.

A code word of a balanced code represents a set of information bits. One of the tasks of the receiver circuitry may be to recover these information bits. This recovery process may comprise several tasks such as amplification, equalization, analog-to-digital conversion, decoding and other suitable signaling processing. Collectively these processing steps are referred to herein as "processing a balanced code". The operation of processing a balanced code may include one or more of: amplification of the signals representing the balanced code, performing equalization and/or filtering on the signals representing the balanced code, non-linear filtering on the signaling representing the balanced code to detect the presence of particular symbols and latching the signals representing the balanced code. It is often desirable to be able to perform several of these tasks in a power efficient way. In accordance with at least one embodiment of the invention, method and circuit techniques that are matched to balanced codes may recover the original information in a noise resilient and power efficient manner.

FIG. 1 depicts aspects of an example processing unit 100 for a balanced code in accordance with at least one embodiment of the invention. The processing unit 100 has n inputs 110 (where, as is conventional, n is a suitable integer). On each of these inputs 110 a signal is present (e.g., an electronic signal representing '0' or '1') that represents one of the coordinates of the code word of the balanced code. The processing unit 100 may include n controlled sources or amplifiers 120. Each of these controlled sources 120 may include a terminal (e.g., a signal coupling) that is connected to the inputs 110, a terminal that is connected to the outputs 150 and a terminal that is connected to a common node 130. The common node 130 may facilitate a resilience to common-mode noise and/or power efficient operation. As will be apparent to one of skill in the art, the connection of the controlled source 120 to the inputs, outputs and common node may comprise other components not explicitly shown in FIG. 1. The energy required to operate the processing unit 100 may be supplied by energy source 140 and the energy may be supplied through common node 130. In accordance with at least one embodiment of the invention, the energy supplied by the energy source 140 is shared across the controlled sources 120.

In accordance with at least one embodiment of the invention, the controlled sources 120 may incorporate one or more metal-oxide-silicon (MOS) transistors and/or bipolar transistors. Such transistors may be integrated in a chip (e.g., an integrated circuit or IC chip). In accordance with at least one embodiment of the invention, the controlled sources 120 may be implemented as a passive component such as a resistor or capacitor. In this case the controlled sources may comprise fewer terminals (e.g., two), as will be apparent to one of skill in the art familiar with resistors and capacitors.

Below, further aspects and/or details of processing units for balanced codes in accordance with at least one embodiment of the invention are described. For clarity, the above example of processing unit 100 is referenced consistently. However, processing unit 100 is not a limiting example. Processing units in accordance with at least one embodiment of the invention may implement one or more of: amplification for balanced codes, linear equalization for balanced codes, non-linear equalization for balanced codes, analog-to-digital conversion for balanced codes and decoding and detection of balanced codes.

Amplification for Balanced Codes

Figure 2:
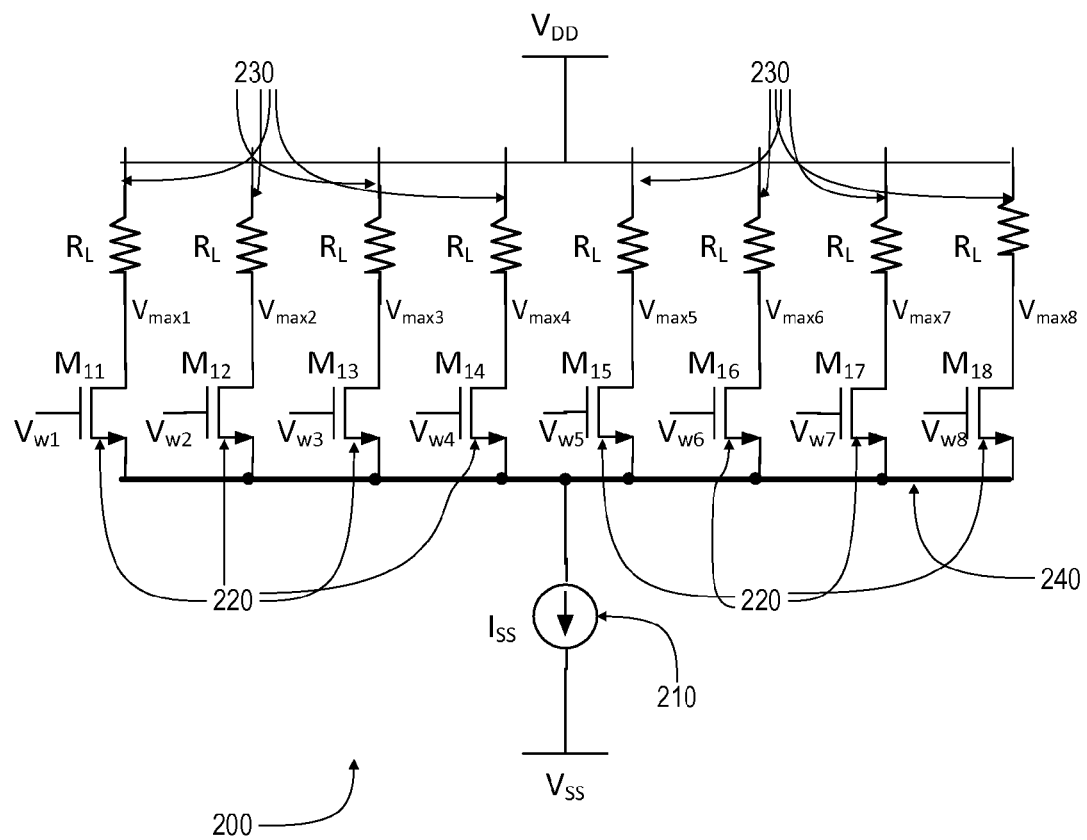
FIG. 2 is a schematic diagram depicting aspects of an example amplification circuit in accordance with at least one embodiment of the invention.

In accordance with at least one embodiment of the invention, a processing unit 100 may perform amplification of signals representing a word of a balanced code. FIG. 2 depicts aspects of an example amplification circuit 200 that can be used for a balanced code that operates on eight wires. The circuit 200 may include a current source 210 that is connected to a common node 240. The current source 210 may sink a current of size $I_{SS}$ from the common node 240. The current source 210 may take the role of the energy source 140 in FIG. 1. The inputs to the circuit 200 of FIG. 2 include the voltages $V_{w1}, \ldots, V_{w8}$ and these are connected to the gates of transistors 220. The sources of the transistors 220 may be connected to the common node 240. The current that is supplied by current source 210 may be divided among the eight branches 230. The amount of current that each branch 230 carries may be proportional to the corresponding gate voltage of the transistor in that branch.

In accordance with at least one embodiment of the invention, the operation of the circuit 200 is such that this correspondence is linear to first approximation. Each of the currents in the branches 230 may flow through a resistor. This converts the current to a voltage and these voltages $V_{max1}, \ldots, V_{max8}$ may correspond to the output of the circuit 200. In the circuit 200, common mode noise that is present on the inputs $V_{w1}, \ldots, V_{w8}$ may be rejected. Since the input voltages correspond to a balanced code only a single tail current source 210 need be used. This can make the circuit 200 power efficient. Without significant modification the circuit 200 can be used to amplify four differential input signals and generate four differential output signals. Therefore, this circuit 200 can be used in multi-mode applications when the user wants to switch from one application to other ones. In accordance with at least one embodiment of the invention, the balanced code used is a sparse signaling code and may be the 8b8w code described in Cronie III. As will be apparent to one of skill in the art, the circuit 200 may easily be adapted to a different number of inputs and outputs.

Figure 3:
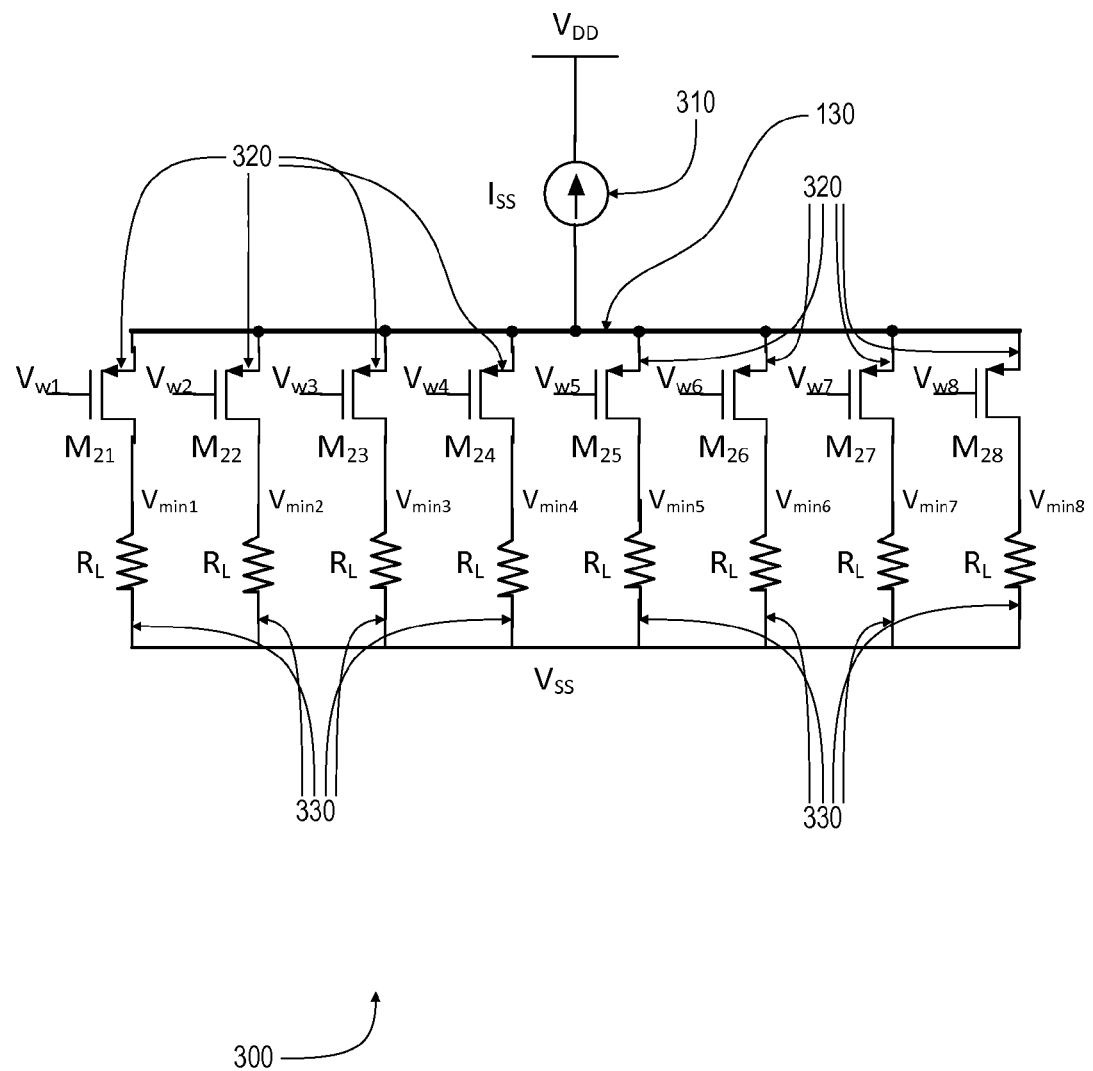
FIG. 3 is a schematic diagram depicting aspects of another example amplification circuit in accordance with at least one embodiment of the invention.

In some cases it may be an advantage to implement the circuit of FIG. 2 with PMOS transistors. FIG. 3 depicts aspects of an example such circuit 300 in accordance with at least one embodiment of the invention. The circuit 300 of FIG. 3 includes a current source 310 that is connected to a common node 340. The current source 310 may take the role of the energy source 140 in FIG. 1. The inputs to the circuit of FIG. 3 correspond to the voltages $V_{w1}, \ldots, V_{w8}$ and these are connected to the gates of transistors 320. The sources of the transistors 320 may be connected to the common node 340. The current that is supplied by current source 310 is divided across the eight branches 330. The amount of current that each branch 330 carries may be proportional to the corresponding gate voltage of the transistor in that branch. In accordance with at least one embodiment of the invention, the operation of the circuit is such that this correspondence is linear to first approximation. Each of the currents in the branches 330 may flow through a resistor. This converts the current to a voltage and these voltages $V_{min1}, \ldots, V_{min8}$ may correspond to the output of the circuit 300. In the circuit 300, common mode noise that is present on the inputs $V_{w1}, \ldots, V_{w8}$ may cancel. Since the input voltages correspond to a balanced code only a single tail current source 310 need be used. This can make the circuit 300 power efficient. As will be apparent to one of skill in the art, the circuit 300 can be used to amplify four differential input signals and generate 4 differential output signals without significant modification. Therefore, this circuit 300 can be used in multi-mode applications when the user wants to switch from one application to other ones. As will be apparent to one of skill in the art, the circuit may be adapted to a different number of inputs and outputs.

Figure 4:
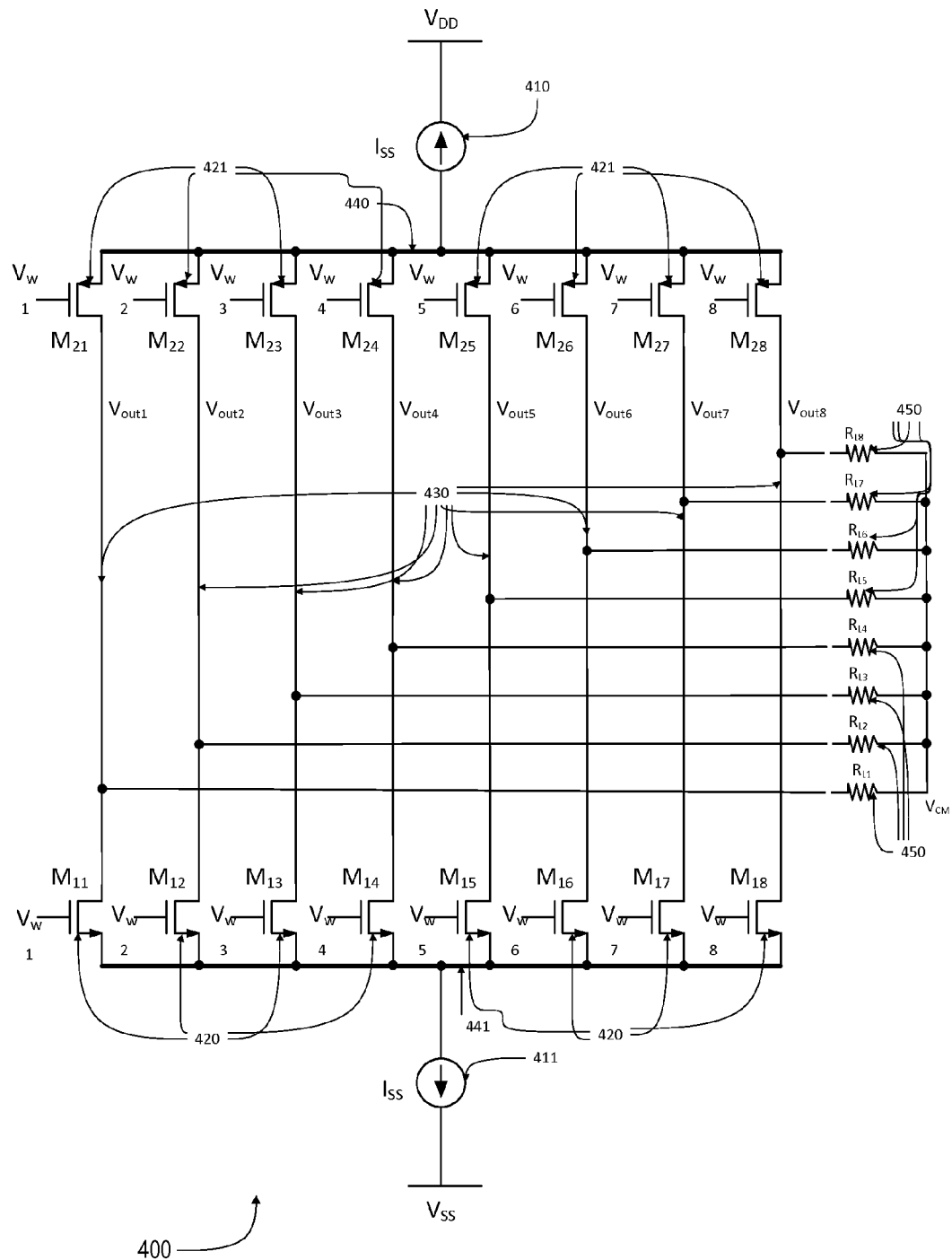
FIG. 4 is a schematic diagram depicting aspects of yet another example amplification circuit in accordance with at least one embodiment of the invention.

In accordance with at least one embodiment of the invention, a circuit topology may be required to process a balanced code that provides more gain than the circuits depicted in FIG. 2 and FIG. 3. FIG. 4 depicts aspects of an example amplification circuit 400 that can be used for a balanced code that operates on eight wires in accordance with at least one embodiment of the invention. The circuit 400 includes two current sources 410 and 411 that are connected to the corresponding common nodes 440 and 441. The inputs to the circuit 400 of FIG. 4 correspond to the voltages $V_{w1}, \ldots, V_{w8}$ and these are connected to the gates of transistors 420 and 421. The source of the transistors 420 and 421 may be connected to the corresponding common node 440 and 441, respectively. The currents that are supplied by current sources 410 and 411 are divided into the eight branches 430. The amount of current that each branch 430 carries may be proportional to the corresponding gate voltage of the transistors in that branch. In accordance with at least one embodiment of the invention, the operation of the circuit is such that this dependence is linear to first approximation.

Each of the currents in the branches 430 flows through a resistor 450. One of the terminals of the resistors 450 is connected to the branches 430 and the other terminals are connected to a common-mode voltage $V_{CM}$. This common-mode voltage may for example be equal to Vdd/2. The resistors 450 convert the current in the corresponding branch to a voltage and these voltages $V_{out1}, \ldots, V_{out8}$ correspond to the output of the circuit. In the circuit 400, common-mode noise that is present on the inputs $V_{w1}, \ldots, V_{w8}$ may be cancelled. Since the input voltages correspond to a balanced code only a single tail current source 411 is needed. This can make the circuit power efficient. The transconductance of PMOS transistors 421 may be configured to sum to the transconductance of the corresponding NMOS transistors 420 to increase the gain and also the bandwidth of the circuit. As will be apparent to one of skill in the art, the circuit 400 can be used to amplify four differential input signals and generate 4 differential output signals without significant modification. Therefore, this circuit can be used in multi-mode applications when the user wants to switch from one application to other ones. As will be apparent to one of skill in the art, the circuit may easily be adapted to a different number of inputs and outputs.

Figure 5:
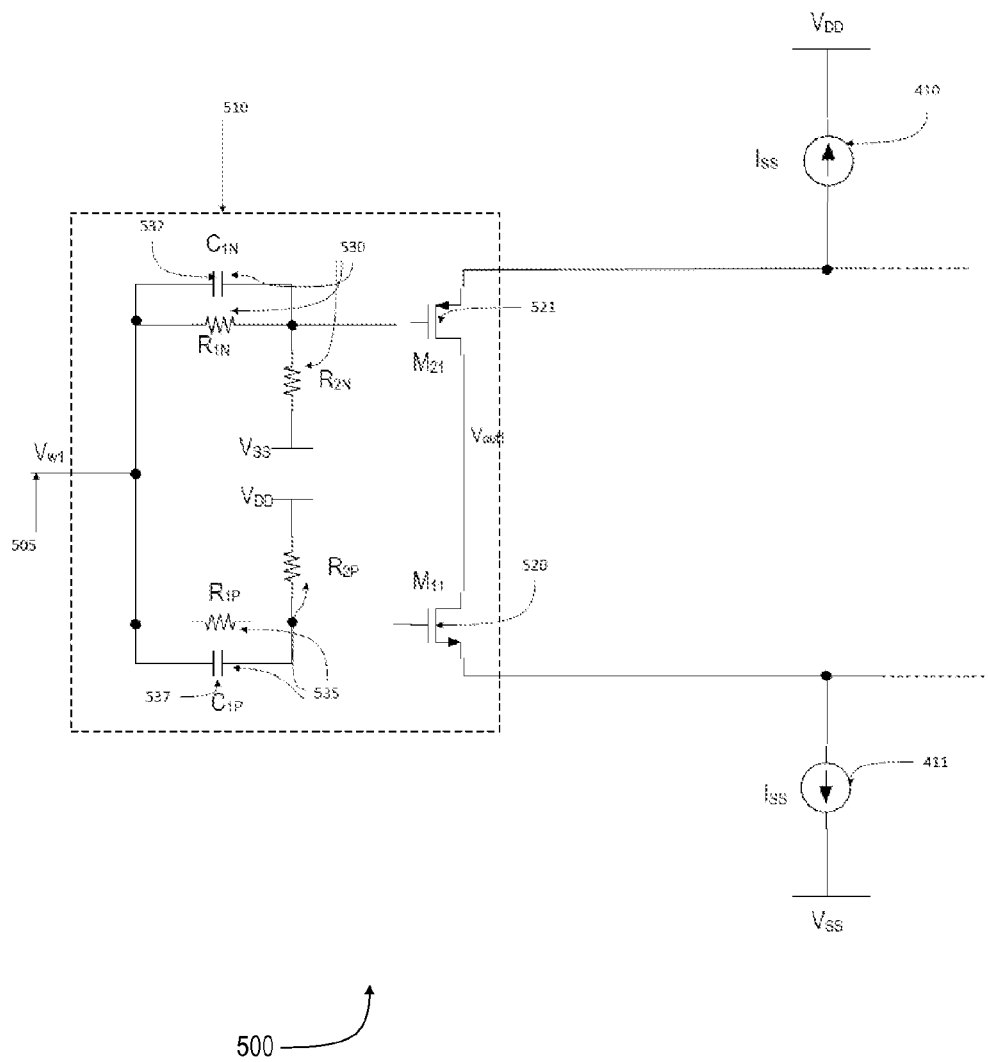
FIG. 5 is a schematic diagram depicting aspects of still another example amplification circuit in accordance with at least one embodiment of the invention.

With technology scaling, the value of Vdd may be lowered and measures may need to be taken to operate the analog circuitry reliably. FIG. 5 shows an example adaption 500 of the circuit in FIG. 4 that is suitable for low voltage operation. FIG. 5 shows the first branch 510 of the branches 430 in FIG. 4. The input to this branch is the voltage 505. The circuit configuration in branch 510 employs two passive networks 530 and 535 to change the DC level for input NMOS transistor 520 and PMOS transistors 521. The network 530 corresponding to NMOS transistor 520 changes the DC level at the gate of NMOS transistors closer to Vdd to produce more headroom for these transistors and also for the tail bias current sources. The network 535 corresponding to the PMOS transistor 521 changes the DC level at the gate of PMOS transistors closer to ground to produce more headroom for the PMOS transistors and also for the tail bias current sources. In accordance with at least one embodiment of the invention, passive networks 530, 535 may employ passive components with a frequency selective transfer. In FIG. 5, networks 530 and 535 include capacitors 532 and 537, respectively.

Using such an RC network can enable several possibilities. For example, the DC bias at the gate of NMOS transistor 520 and PMOS transistor 521 may be changed such that the voltage headroom for these transistors is increased further. As another example, the RC network can provide frequency compensation and is useful for equalization. While in low frequencies 532 and 537 act as resistive dividers and hence change the DC bias voltage, at high frequencies, the parallel capacitors 532 and 537 show less impedance and will provide a boost at high frequencies. Furthermore, capacitors 532 and 537 can provide appropriate and independent DC operating conditions for the input transistors 520, 521.

Linear Equalization for Balanced Codes

The signals that represent a code word of a balanced code may be transmitted on wires that have a frequency selective transfer. In this case equalization circuitry may be required to reliable detect the information represented by the code word. For this purpose equalization circuitry may be used to compensate for the frequency selective channel transfer. In case a balanced code is used, power-efficient equalization circuitry can be designed. Several examples are described below.

Figure 6:
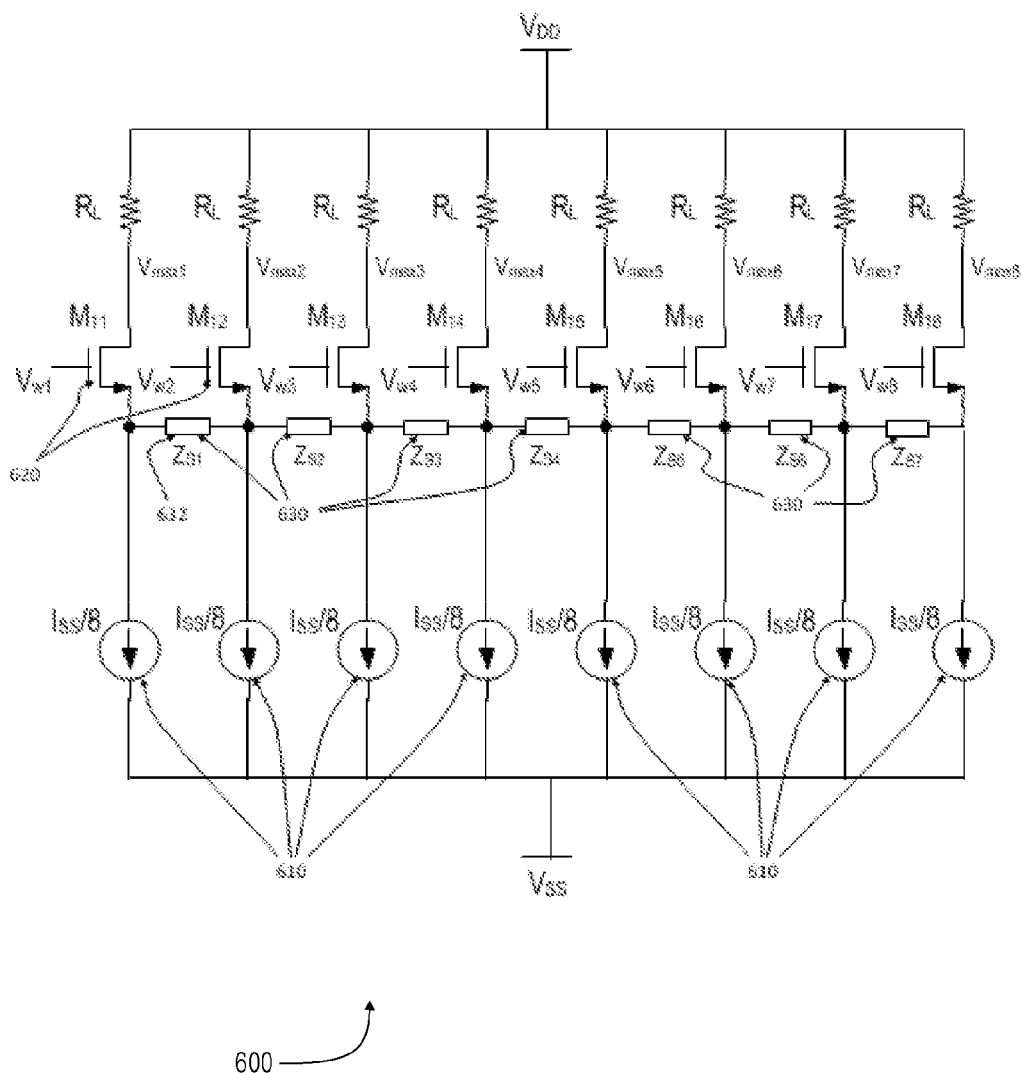
FIG. 6 is a schematic diagram depicting aspects of an example linear equalizer circuit for a balanced code that operates on eight wires in accordance with at least one embodiment of the invention.

FIG. 6 depicts aspects of an example linear equalizer circuit 600 for a balanced code that operates on eight wires in accordance with at least one embodiment of the invention. The inputs of the circuit 600 are denoted by $V_{W1}, \ldots, V_{W8}$ and the outputs of the circuit by $V_{max1}, \ldots, V_{max8}$. The topology of the circuit is similar to the amplification circuit of FIG. 2. However, tail current source 210 of FIG. 2 is split into eight current sources 610 that directly sink from the branches. Compared to FIG. 2 the total current is kept constant and each current source 610 sinks a current of size $I_{SS}/8$ from its corresponding branch. The source terminals of neighboring transistors are connected by impedances 630. For example, source terminals of transistors 620 may be connected by impedance 632. The frequency response of the circuit may depend on the values of source impedances 630. In accordance with at least one embodiment of the invention, source impedances 630 may be chosen as resistors such that the circuit acts as a linear amplifier with a flat frequency response and a well-controlled gain that depends on the ratio of the impedance at the drain of transistors to the impedance in the source of transistors. When a parallel RC network is used for source impedances 630, the circuit may exhibit a frequency dependent response. In low frequencies, the gain will drop while at high frequencies the gain remains high. Therefore, the circuit shows higher gain at high frequencies. In this case, the circuit may be used to equalize channels that exhibit a low pass behavior.

Figure 7:
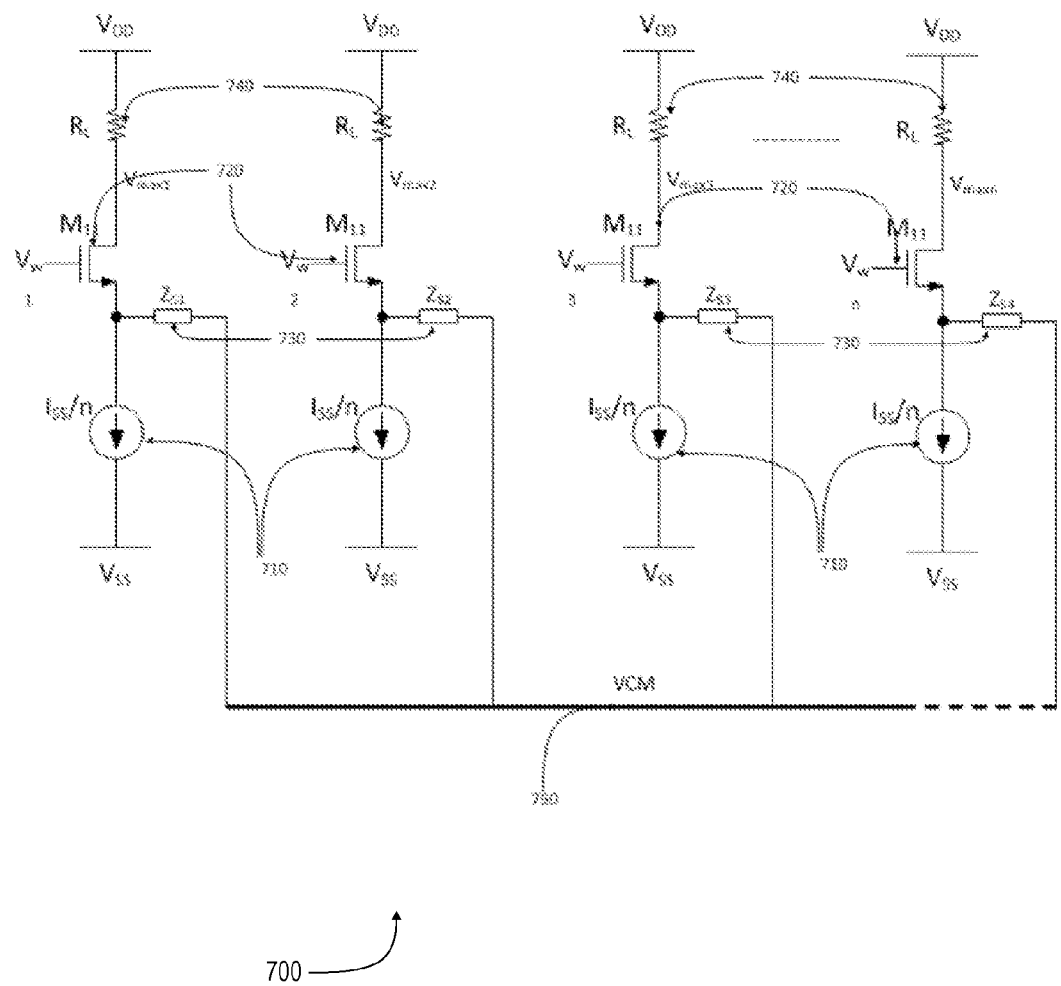
FIG. 7 is a schematic diagram depicting aspects of an example circuit that can be used for amplification and equalization in accordance with at least one embodiment of the invention.

An example circuit 700 that can be used for amplification and equalization is shown in FIG. 7. The input of the circuit 700 includes the signals $V_{W1}, \ldots, V_{Wn}$ which are applied to the gates of NMOS transistors 720. In accordance with at least one embodiment of the invention, n may be chosen as the size of a code word of the balanced code. The outputs of the circuit 700 includes the signals $V_{max1}, \ldots, V_{maxn}$. These signals are voltages at the drain of transistors 720. Current sources 710 sink a current of size $I_{SS}/n$ from their corresponding branch. The source of the transistor in the ith branch 720 is connected to a common node 750 through impedance $Z_{Si}$. The impedances 730 may be chosen as resistors in case the circuit 700 of FIG. 7 may operate as an amplifier. In case a network with a frequency selective transfer is used for the impedances 730, the circuit 700 of FIG. 7 may operate as a filter and perform equalization. In accordance with at least one embodiment of the invention, the impedances 730 may be chosen such that the circuit 700 can be used for equalization purposes. This may be done by using a parallel RC network for the impedances 730.

The common node 750 may be left floating since the input signals represent a code word of a balanced code. In the circuit 700, common-mode noise that is present on the input signals may be rejected. The circuit 700 may be relatively power efficient. Compared to the circuits in FIG. 2-4, a current source is present in each branch. However, the strength of the currents supplied by these current sources may be scaled down by a factor of n. This can result in a similar low-power operation.

In accordance with at least one embodiment of the invention, the transfer from input to output of the circuits exemplified in FIG. 5-7 may be made programmable. In the circuit 700 of FIG. 7, for example, this may be accomplished by making of the elements that make up the network of impedances 730 programmable. The circuit topologies of FIG. 5-7 can be implemented with both NMOS and PMOS devices. Furthermore, these circuits may be adjusted to use complementary MOS devices (NMOS and PMOS) as is for instance the case in FIG. 4-5. In accordance with at least one embodiment of the invention, NPN or PNP transistors may be used as the amplifying elements.

Figure 8:
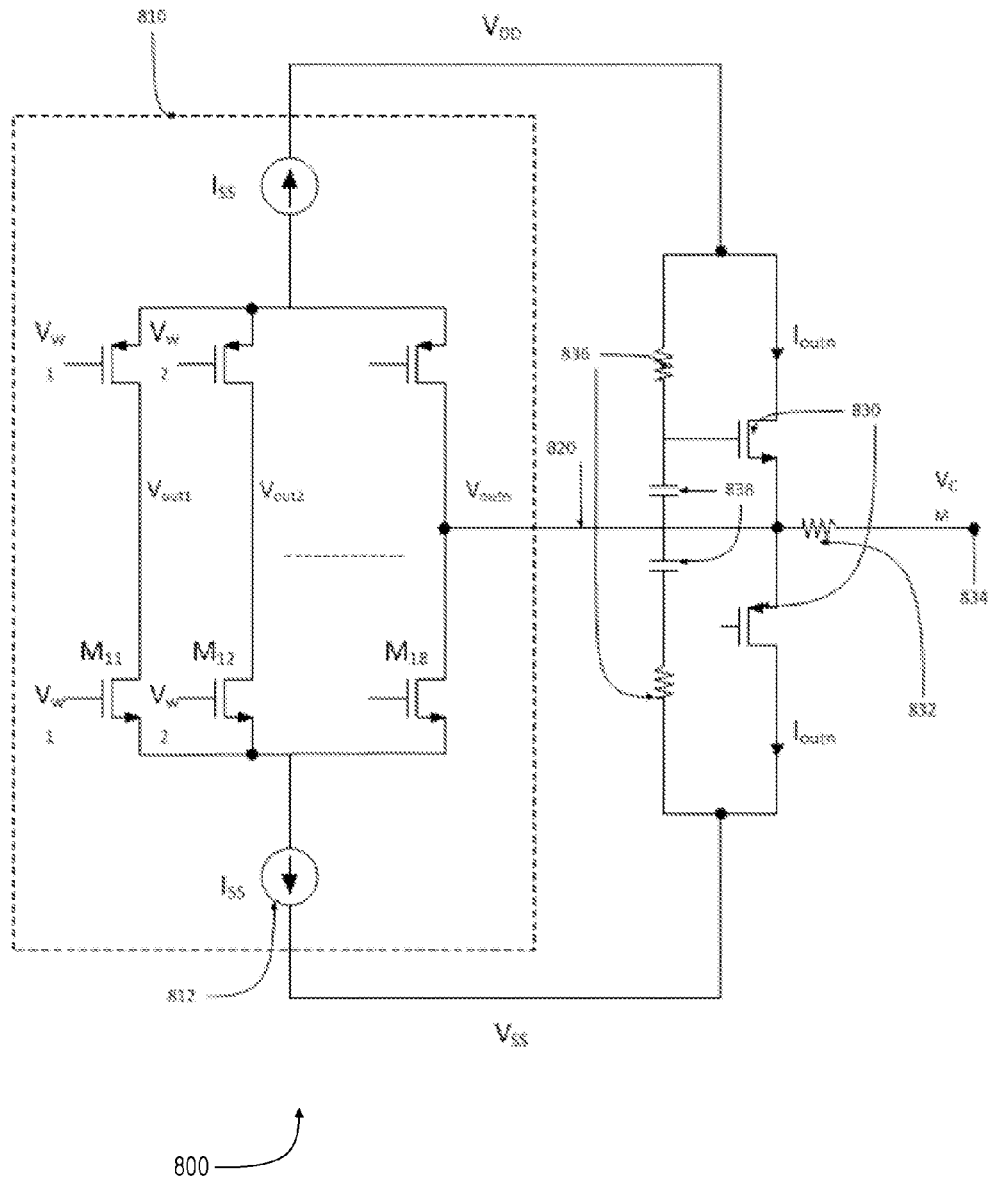
FIG. 8 is a schematic diagram depicting aspects of an example balanced amplifier with a capability of equalizing a frequency dependent attenuation of a channel in accordance with at least one embodiment of the invention.

In accordance with at least one embodiment of the invention, it is desirable to employ a complementary amplifier as described above with reference to FIG. 4 or 5 with additional equalization capabilities. FIG. 8 depicts aspects of an example balanced amplifier with capability of equalizing the frequency dependent attenuation of the channel. The input to the circuit 800 includes signals $V_{w1}, \ldots, V_{wn}$ and the outputs of the circuit include signals $V_{out1}, \ldots, V_{outn}$. The amplifier may employ a complementary input topology that, in FIG. 8, is constructed from NMOS transistors and PMOS transistors to improve the gain and bandwidth of the circuit. Each transistor may be biased using a single tail bias current 812. The outputs $V_{out1}, \ldots, V_{outn}$ of the complimentary amplifier in block 810 may be fed to a second network. For the output $V_{outn}$ this network may include the transistors 830, resistors 836, resistor 832 and capacitor 838. One of the terminals of resistor 832 may be connected to the common node 834. The capacitors 838 together with the resistors 836 can determine the frequency characteristics of the amplifier. As will be apparent to one of skill in the art, by choosing the capacitors properly, the frequency characteristics may be changed in such a way that the circuit 800 can be used for equalization. In accordance with at least one embodiment of the invention, the techniques described with reference to FIG. 8 can be combined with techniques described with reference to FIGS. 5-7.

NON-Linear Equalization for Balanced Codes

In chip-to-chip communications, it may be desirable to be able to compensate for channel attenuation. In accordance with at least one embodiment of the invention, a decision feedback equalizer (DFE) may be incorporated into a suitable equalization architecture. A DFE is a non-linear equalizer that can exhibit a superior performance compared to linear equalizer architectures. For balanced codes, efficient circuit topologies may be derived using the property that the signals representing a code word of a balanced code sum to the same constant. An example DFE architecture is now further described with reference to FIG. 9.

Figure 9:
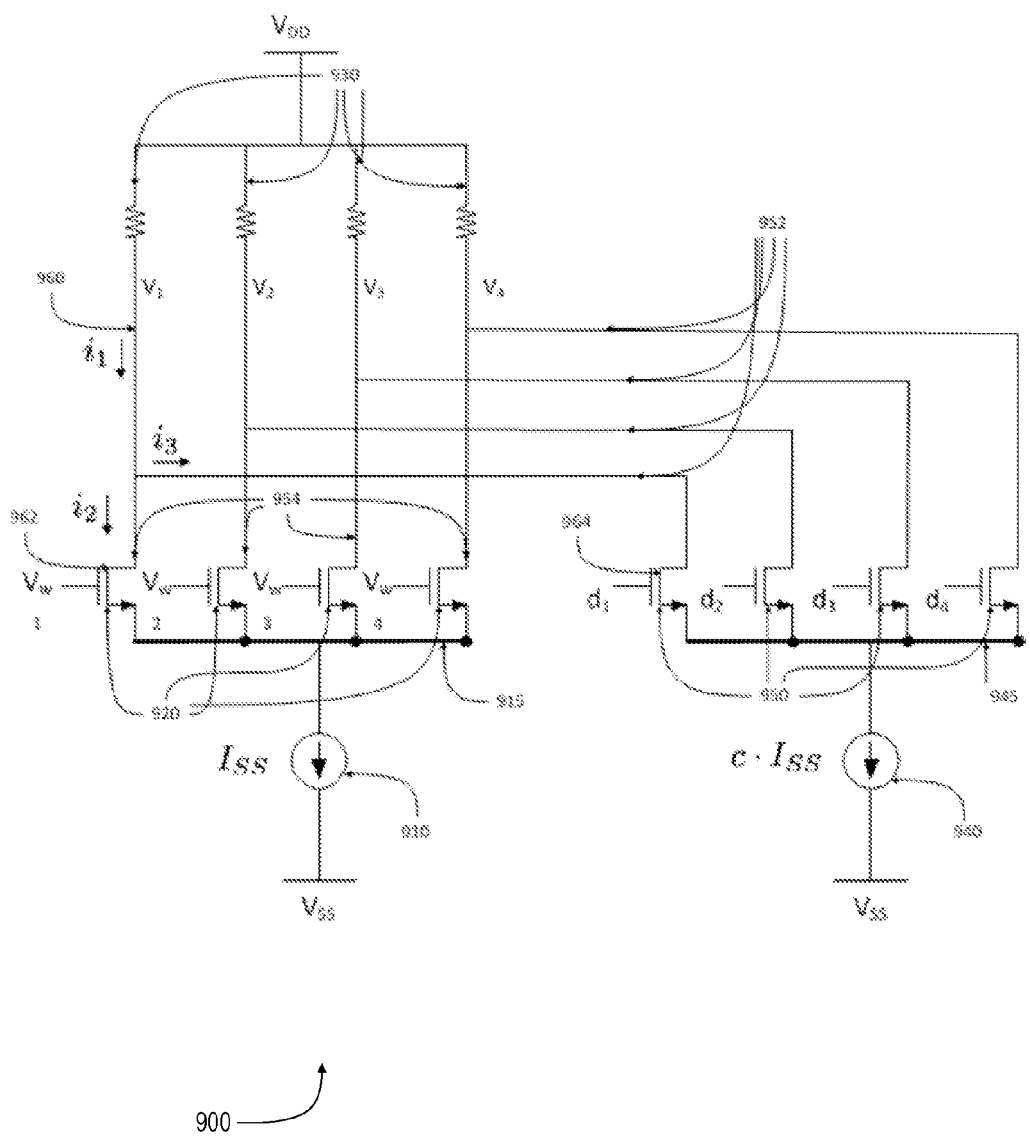
FIG. 9 is a schematic diagram depicting aspects of an example feedback component of a decision feedback equalizer in accordance with at least one embodiment of the invention.

FIG. 9 depicts aspects of an example feedback part of a DFE that may be used for a balanced code that operates on four wires in accordance with at least one embodiment of the invention. The architecture is shown for a single tap equalizer. The architecture can be extended to more or fewer wires and multiple DFE taps. The inputs of the circuit 900 include the signals $V_{w1}, \ldots, V_{w4}$ that are applied to the gates of transistors 920. Transistors 920 and a current source 910 can form an amplifier architecture as is shown in FIG. 2. A constant current of strength $I_{SS}$ is drawn from common node 915. This current is divided across the branches 930 according to the input signals $V_{w1}, \ldots, V_{w4}$. For clarity, it is assumed that the decision on the code word that has been send in a previous time interval is available and represented by the signals $d_1, \ldots, d_4$. These signals may be fed to the gates of transistors 950. The transistors 950 steer a current from a current source 940 that has strength of $cI_{SS}$ into branches 952. The values of $d_1, \ldots, d_4$ determine how much current is steered into the respective branch. The signals $d_1, \ldots, d_4$ may represent a hard decision or a soft-decision of the code word that has been sent in the previous timeslot.

The coefficient c is chosen depending on the characteristics of the channel for which the DFE is designed. The currents steered into branches 952 are superimposed to the currents steered into branches 954. This performs the cancellation operation of the DFE. The resulting currents flow through resistor 930. The outputs of the circuit 900 include the voltages $V_1, \ldots, V_4$. These voltages may be sampled and the balanced code may be decoded resulting a new decision for the next time slot. FIG. 9 depicts a component of the DFE. As will be apparent to one of skill in the art, other circuitry and control may be used to implement a full DFE.

In the DFE front-end of FIG. 9, the circuit 900 provides a resilience against common-mode noise present on the input signals. Common node techniques that may be used for processing balanced codes are also used in the architecture of FIG. 9. This can leads to a relatively low power operation of the DFE. For example, simplifying the receiver architecture can result in less silicon area and system complexities. This may be a result of using one minimum and one maximum detector for all 8 (or more) number of channels instead of, for example, one analog-to-digital converter (ADC) for each channel. Power dissipation may be saved by combining the front-end minimum and maximum detection with the DFE part.

VOLTAGE-to-TIME Conversion for Balanced Codes

Figure 10:
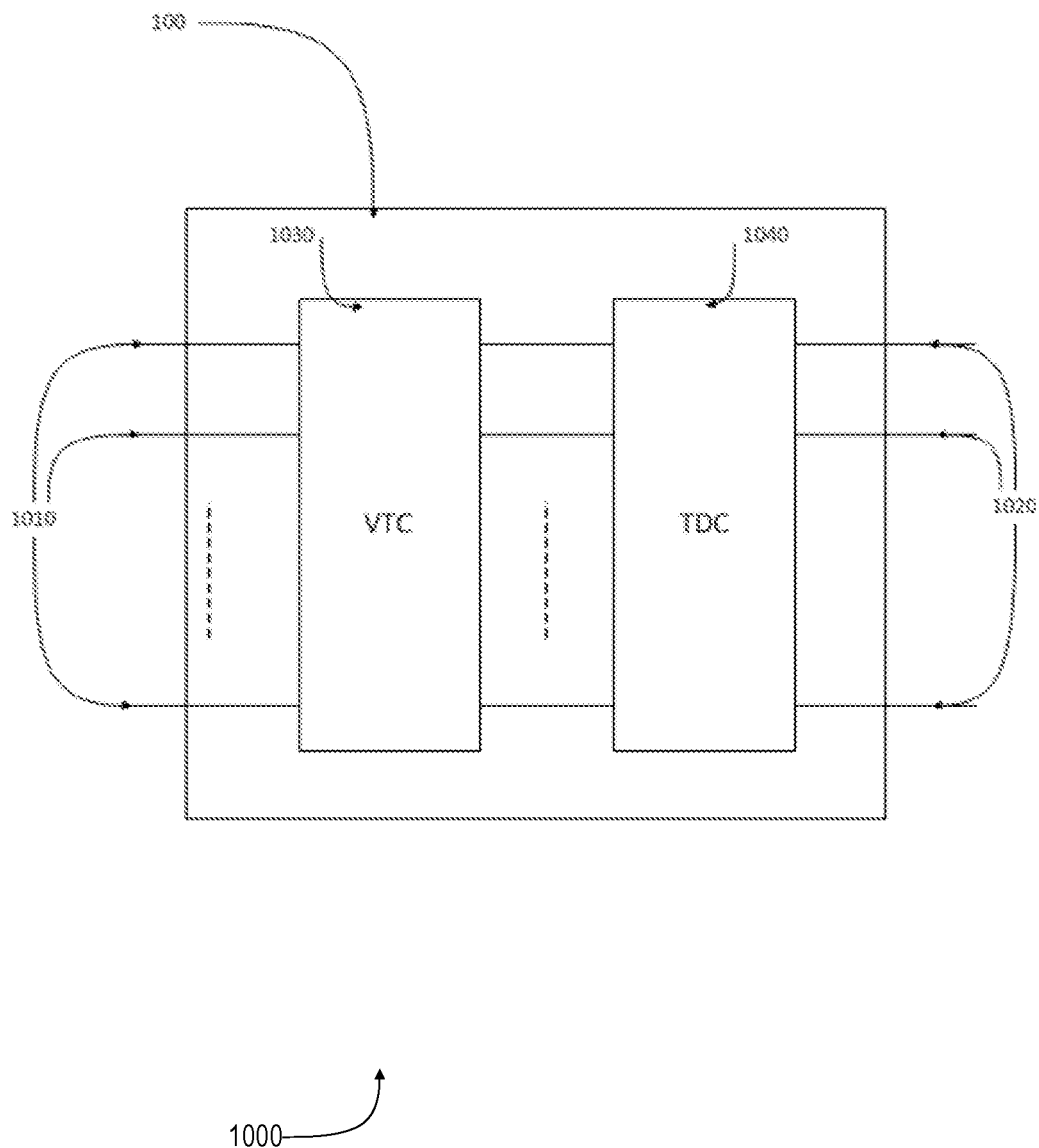
FIG. 10 is a schematic diagram depicting aspects of an example processing unit that implements an analog-to-digital converter in accordance with at least one embodiment of the invention.

In accordance with at least one embodiment of the invention, an analog-to-digital converter (ADC) may be employed to convert the signals that represent the code word of a balanced code to a digital representation. An architecture 1000 for an ADC that may exploit the properties of a balanced code is described with reference to FIG. 10. FIG. 10 depicts aspects of an example processing unit 100 that implements an ADC. The ADC may include a voltage-to-time converter (VTC) 1030 and a time-to-digital converter (TDC) 1040. The inputs 1010 of the ADC represent a code word of a balanced code and are input to the VTC 1030. The VTC 1030 converts the input signals 1010 to a set of digital signals such that the original amplitude information is encoded into the transition moment of these digital signals. The VTC 1030 may employ an architecture that allows for a joint conversion of the input signals 1010 to digital waveforms.

Figure 11:
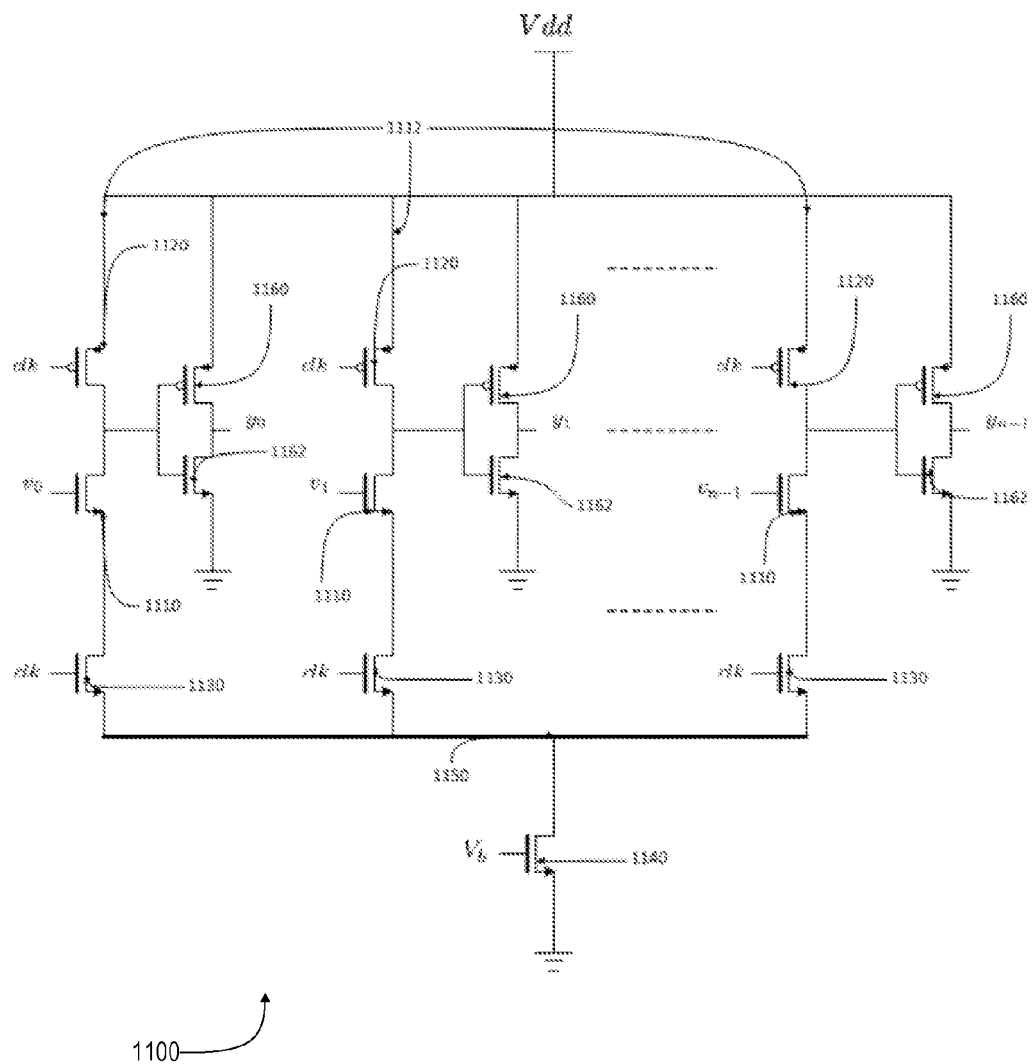
FIG. 11 is a schematic diagram depicting aspects of an example voltage-to-time converter in accordance with at least one embodiment of the invention.

An example such VTC is now further described with reference to FIG. 11. FIG. 11 depicts aspects of an example VTC 1100 that operates on n wires in accordance with at least one embodiment of the invention. The input signals of the VTC 1100 are denoted by $v_0, \ldots, v_{n-1}$. The VTC 1100 includes n branches 1112 and each branch may include a PMOS transistor 1120, a NMOS transistor 1110, and a NMOS transistor 1130. The drain of the PMOS transistors 1120 is connected to the input of an inverter that comprises transistors 1160 and 1162. The input signals $v_0, \ldots, v_{n-1}$ are applied to the gates of NMOS transistors 1110. A common clock signal that is denoted by clk in FIG. 11 is applied to PMOS transistors 1120 and NMOS transistors 1130. The output of the VTC comprises the outputs of the inverters that comprise transistors 1160, 1162. These outputs are denoted by $y_0, \ldots, y_{n-1}$ in FIG. 11. The VTC 1030 comprises a NMOS transistor 1140 of which the gate is set to a reference voltage $V_b$. The NMOS transistor 1140 determines the maximum of the sum of currents that flows through the branches 1112. Transistor 1140 may be omitted and the maximum current may be determined by scaling transistors 1130 accordingly. In accordance with at least one embodiment of the invention, the input signals $v_0, \ldots, v_{n-1}$ may have a common-mode voltage unequal to zero such that the NMOS transistors are on for a 0 symbol of the balanced code. In case the clock signal clk is high the NMOS transistors 1130 are on and the PMOS transistors 1120 are off. In this case the nodes corresponding to the drain of PMOS transistors 1120 are close to ground and the outputs $y_0, \ldots, y_{n-1}$ of the inverters 1160, 1162 are high. In case the clock signal clk becomes low the NMOS transistors 1130 turn off and the PMOS transistors 1120 turn on. The amount of current flowing in the ith branch of the branches 1112 is proportional to the gate voltage of the ith NMOS transistor of NMOS transistors 1110. This current will charge the drain node corresponding to the ith PMOS transistor. Once the voltage of this node crosses the threshold of the inverter 1160, 1162 the corresponding output will become low. The amount of time it takes for the output of the inverter to become low is proportional to the amplitude of the ith input signal. In the VTC 1100 of FIG. 11, common-mode noise on the inputs may be rejected. The circuit topology of the VTC 1100 FIG. 11 is relatively small in area. The VTC 1100 of FIG. 11 may be used with conventional TDC architectures known by those of skill in the art.

Decoding and Detection for Balanced Codes

In accordance with at least one embodiment of the invention, a ternary balanced code is used. Examples of ternary balanced codes include the 4b5w code and the 8b8w code. The 4b5w code and 8b8w code are a type of balanced codes that are called sparse signaling codes. These codes are detailed in Cronie III. The code words of a sparse signaling code contain '1' symbols, '−1' symbols and '0' symbols. To decode ternary sparse signaling codes one may employ an architecture that is based on finding the positions of the 1 symbols and −1 symbols only. For this purpose, max-detector circuits that may be employed to find the positions of the 1 symbols are described below. Furthermore, min-detector circuits that may be employed to find the positions of the −1 symbols are also described below.

Figure 12:
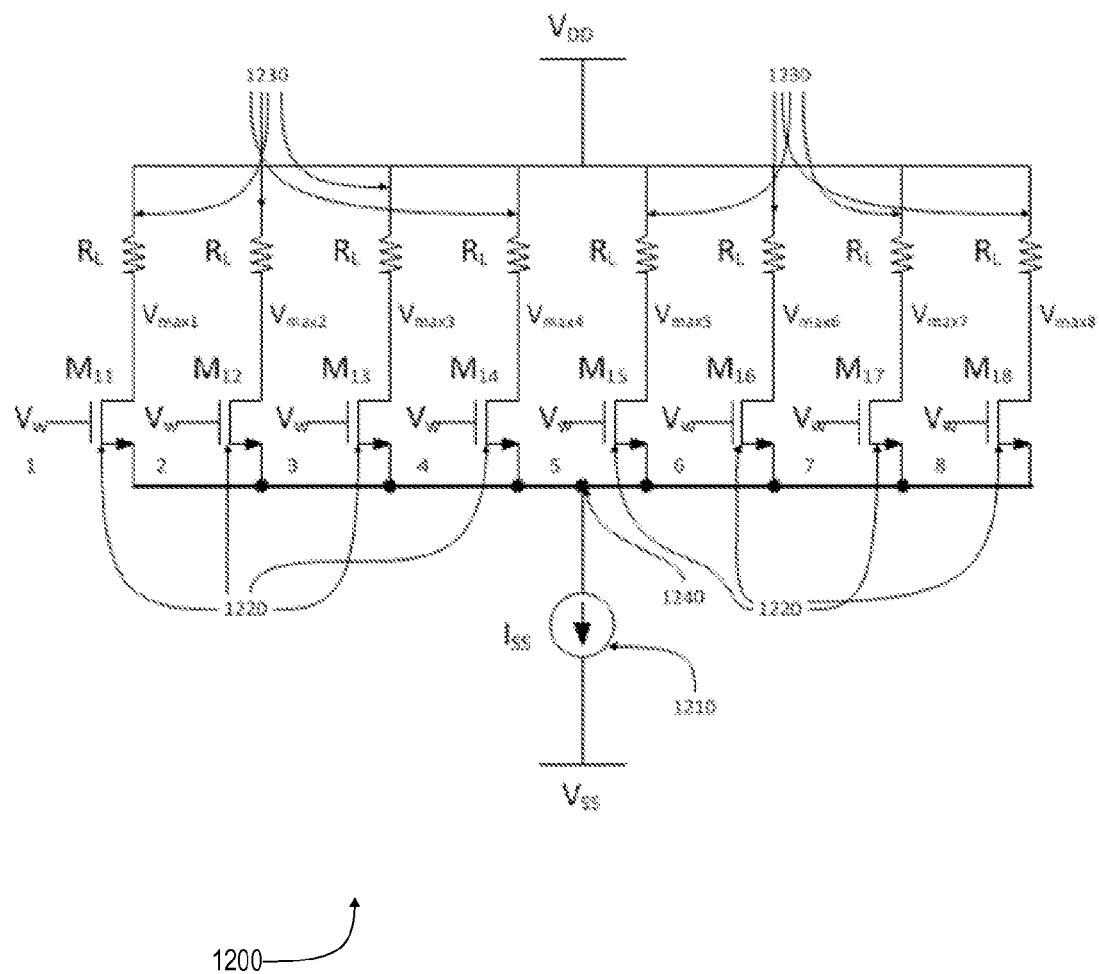
FIG. 12 is a schematic diagram depicting aspects of an example max-detector circuit operating on eight input signals in accordance with at least one embodiment of the invention.

An example max-detector circuit 1200 is now further described with reference to FIG. 12. FIG. 12 depicts aspects of the example max-detector circuit 1200 that operates on eight input signals in accordance with at least one embodiment of the invention. These input signals are denoted by $V_{W1}, \ldots, V_{W8}$. These inputs are applied to the gates of NMOS transistors 1220. NMOS transistors 1220 are biased using a single current source 1210. With this type of common-source technique the current at the output branches 1230 will be proportional to the input signals $V_{W1}, \ldots, V_{W8}$. Once the amplitude of the input signals is high enough the circuit becomes nonlinear and can act as max detector where most of the tail bias current 1220 will flow only in the output branches that are connected to the input signals with the highest values. The current in the output branches then will be converted to output voltages $V_{max1}, \ldots, V_{max2}$ by the load resistors. The circuit 1200 may reject the input common-mode noise and does not need a reference signal for determining whether the data signal carries a '1' symbol or not. The circuit 1200 may enhance the noise margin of the data signal by comparing one signal with the average of the rest of signals. The power dissipation of the circuit 1200 is relatively low since only one maximum detector circuit is needed for the input wires. As will be apparent to one of skill in the art, the circuit can easily be extended to a different number of wires.

The transistors of the circuit shown in FIG. 12 can be replaced with PMOS transistors to implement a min-detector. In accordance with at least one embodiment of the invention, this may lead to a circuit topology similar to that of FIG. 3.

Figure 13:
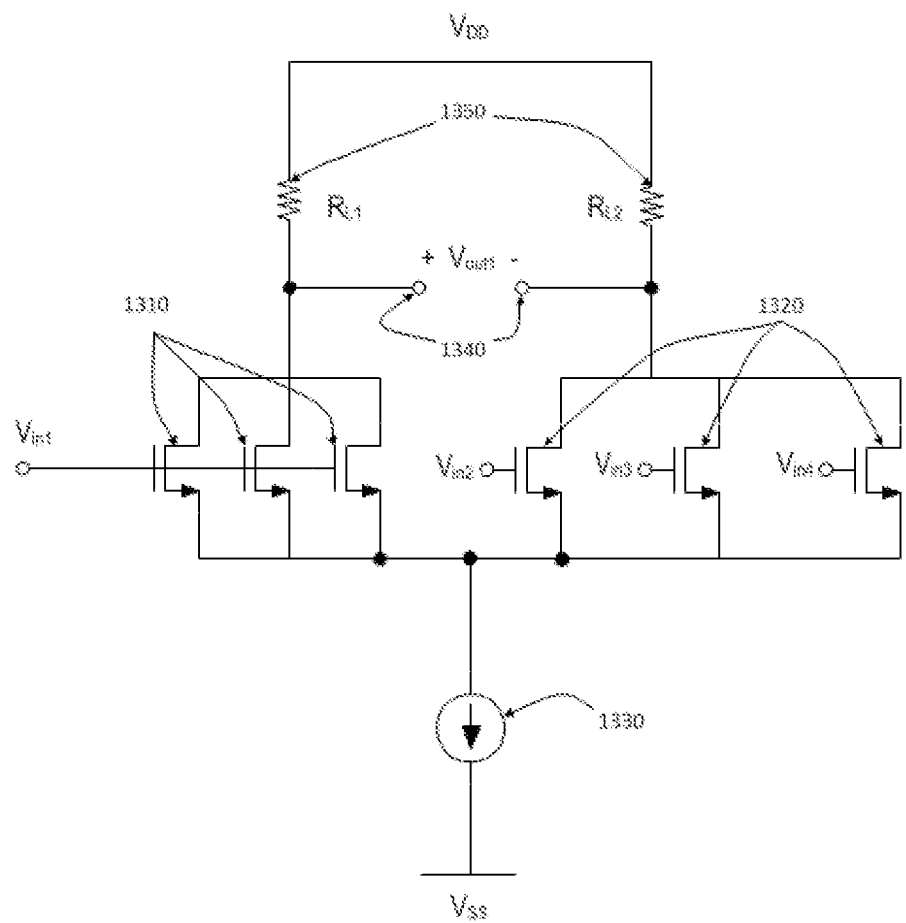
FIG. 13 is a schematic diagram depicting aspects of an example circuit configuration with a differential output in accordance with at least one embodiment of the invention.

In accordance with at least one embodiment of the invention, it may be desirable for circuits to have a differential output. FIG. 13 depicts aspects of an example circuit 1300 with a differential output in accordance with at least one embodiment of the invention. The circuit 1300 may be used as an amplifier or a max-detector circuit depending on the operating regime of the transistors (linear or non-linear, respectively). The max-detector circuit of FIG. 13 operates on four wires and may detect the presence of a '1' symbol on the first wire. For the other wires a corresponding circuit may be used. As will be apparent to one of skill in the art, the circuit 1300 of FIG. 13 can easily be extended to operate on a different number of wires. The input signals are denoted by $V_{in1}, \ldots, V_{in4}$. Input signal $V_{in1}$ is applied to the gates of transistors 1310. The inputs $V_{in2}, \ldots, V_{in4}$ are applied to the inputs of transistors 1320, respectively. In accordance with at least one embodiment of the invention, the transistors 1310, 1320 have the same widths and lengths. The differential output voltage $V_{out1}$ of the circuit is across nodes 1340. If the circuit operates in the linear regime this output is given by Equation 2.

$$V_{out1} = 3V_{in1} - (V_{in2} + V_{in3} + V_{in4}) \tag{Eqn. 2}$$

In case a balanced code is us used the sum of $V_{in2}, \ldots, V_{in4}$ equals $-3V_{in1}$ and the differential output voltage $V_{out1}$ is proportional to $V_{in1}$. When the transistors 1310, 1320 operate in the linear regime the circuit 1300 of FIG. 13 may be used as an input amplifier. When the transistors 1310, 1320 operate in the non-linear regime the circuit may be used to detect to positions of the positive values of the signals representing a word of balanced code. In accordance with at least one embodiment of the invention, the transistors 1310, 1320 may be replaced by PMOS transistors. In this case the circuit 1300 may be used as a min-detector to detect the positions of the negative values of the signals representing a word of a balanced code.

The use of the circuitry 1300 described above is not limited to ternary balanced codes. Another example is provided by the binary balanced code of length 6 in which the code words are the 20 different permutations of the vector (+1,+1,+1,−1,−1,−1), or a suitable subset thereof. Here, when comparing 6 times the value of a coordinate position against the sum of the other coordinate positions, the resulting comparison will be the sign of the value of the given coordinate position. The circuitry in FIG. 13 may thus be an alternative to convention types of detection, such as types based on pairwise comparisons of code word positions.

Advantages of Processing Circuits for Balanced Codes

The circuits described above for processing of balanced codes provide multiple advantages. For example, the circuits for amplification and equalization provide resilience against common-mode noise that may be present on the input signals. The combination of the signals satisfying the balanced code property as given by Equation 1 and the presence of common nodes such as common node 130 of FIG. 1 facilitate such resilience. The amplifiers of FIGS. 2 and 3 show the common node from which a single current source sinks current. The same holds for the equalization circuits exemplified in FIGS. 4 and 5. In FIG. 6 multiple common nodes exist between the impedances 630. The topology of FIG. 6 may be changed to the topology of FIG. 7 to create a single common node 750.

As another example, the power consumption of the described circuits is relatively low. One reason for this is the presence of a common node 130 and a single source of energy 140. This single source of energy can take its form as a single or two current sources. For example, in FIG. 2 the single energy source is current source 210. This current source may be implemented as a transistor that is biased in such a way that it provides the required current. Transistor 1140 in FIG. 11 provides this functionality. In a chip-to-chip communication system, the use of these circuit topologies can lead to a lower power consumption of the receiver front-end compared to conventional signaling schemes, for example, based on differential signaling. In accordance with at least one embodiment of the invention, many bits may be represented by a code word of a balanced code and the energy consumption of the circuit can be amortized across these bits.

Further Applications

Balanced codes may also find their use in other applications besides chip-to-chip communications. Many of the methods and circuit techniques disclosed herein can provide similar advantages in these settings. An example is the application of balanced codes in the non-volatile storage of information as is described in Cronie IV. In accordance with at least one embodiment of the invention, the transistors 220 in FIG. 2 or transistors 1110 in FIG. 11 may be replaced by floating gate transistors. The charge trapped on these floating gate transistors will determine the strength of currents in branches 230, 1112 when a predetermined voltage is applied to the floating gate transistors. In settings where a balanced code is used to represent information and processing of the balanced code is required, the circuits described above may be applicable.

All references, including publications, patent applications, and patents, cited herein are hereby incorporated by reference to the same extent as if each reference were individually and specifically indicated to be incorporated by reference and/or were set forth in its entirety herein.

The use of the terms "a" and "an" and "the" and similar referents in the specification and in the following claims are to be construed to cover both the singular and the plural, unless otherwise indicated herein or clearly contradicted by context. The terms "having," "including," "containing" and similar referents in the specification and in the following claims are to be construed as open-ended terms (e.g., meaning "including, but not limited to,") unless otherwise noted. Recitation of ranges of values herein are merely indented to serve as a shorthand method of referring individually to each separate value inclusively falling within the range, unless otherwise indicated herein, and each separate value is incorporated into the specification as if it were individually recited herein. All methods described herein can be performed in any suitable order unless otherwise indicated herein or clearly contradicted by context. The use of any and all examples, or exemplary language (e.g., "such as") provided herein, is intended merely to better illuminate embodiments of the invention and does not pose a limitation to the scope of the invention unless otherwise claimed. No language in the specification should be construed as indicating any non-claimed element as essential to each embodiment of the present invention.

Preferred embodiments are described herein, including the best mode known to the inventors. Further embodiments can be envisioned by one of ordinary skill in the art after reading this disclosure. Different arrangements of the components depicted in the drawings or described above, as well as components and steps not shown or described are possible. Similarly, some features and subcombinations are useful and may be employed without reference to other features and subcombinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the claims below.

What is claimed is:

1. A method for processing a balanced code, the method comprising:
   providing a set of controlled sources;
   placing the controlled sources in a configuration with at least one common node;
   providing at least one current source that sinks a predetermined current from each of the at least one common node;
   obtaining inputs to the controlled sources comprised of at least three values representing the code word of a balanced code; and
   producing a result derived from the current provided by each controlled source.

2. The method of claim 1, wherein the controlled sources are MOS transistors.

3. The method of claim 1, wherein the controlled sources are bipolar transistors.

4. The method of claim 1, wherein processing comprises amplification.

5. The method of claim 1, wherein processing comprises equalization.

6. The method of claim 1, wherein processing comprises time-to-digital conversion.

7. The method of claim 1, wherein the inputs representing the code word of a balanced code are obtained using a resistive-capacitive input circuit.

8. The method of claim 1, wherein at least one of the inputs to the controlled sources is provided by a charge trapped on a floating gate transistor.

9. The method of claim 1, wherein the inputs are further comprised of values derived from processing the code word of a balanced code at an earlier time.

10. The method of claim 1, wherein the balanced code is a sparse signaling code.

11. The method of claim 10, wherein sparse signaling code is a ternary sparse signaling code.

12. The method of claim 11, wherein the ternary sparse signaling code is a 4b5w ternary sparse signaling code or a 8b8w ternary sparse signaling code.

13. A method for processing a balanced code, the method comprising:
    providing a set of controlled sources;
    placing the controlled sources in a configuration with a common node;
    providing a current source that sinks a predetermined current from the common node;
    obtaining inputs to the controlled sources comprised of at least three values representing the code word of a balanced code; and
    producing a result derived from a fraction of the predetermined current provided by each controlled source.

14. A method for processing a balanced code, the method comprising:
    providing a set of controlled sources;
    providing a set of current sources that sink a predetermined current from circuit nodes associated with each of the controlled sources;
    interconnecting the circuit nodes associated with each of the controlled sources with an impedance;
    obtaining inputs to the controlled sources comprised of at least three values representing the code word of a balanced code; and
    producing a result derived from the current provided by each controlled source.

15. The method of claim 14, wherein the impedance is resistive.

16. The method of claim 14, wherein the impedance is comprised of resistive and capacitive elements.

17. The method of claim 14, wherein the impedance comprises one or more impedance elements and at least one of the impedance elements is programmable.

18. The method of claim 14, wherein the interconnecting is between pairs of the circuit nodes.

19. The method of claim 14, wherein the interconnecting is from each of the circuit nodes to a common interconnection node.

20. An apparatus for processing signals corresponding to balanced code signals, comprising:
    a set of controlled sources in a configuration with at least one common node;
    at least one current source that sinks a predetermined current from the at least one common node;
    inputs to the controlled sources comprised of at least three values representing the code word of a balanced code; and
    an output result derived from the current provided by each controlled source.

21. The apparatus of claim 20, wherein the controlled sources are MOS transistors.

22. The apparatus of claim 20, wherein the controlled sources are bipolar transistors.

23. The apparatus of claim 20, wherein processing comprises amplification.

24. The apparatus of claim 20, wherein processing comprises equalization.

25. The apparatus of claim 20, wherein processing comprises time-to-digital conversion.

26. The apparatus of claim 20, wherein the inputs representing the code word of a balanced code are obtained using a resistive-capacitive input circuit.

27. The apparatus of claim 20, wherein at least one of the inputs to the controlled sources is provided by a charge trapped on a floating gate transistor.

28. The apparatus of claim 20, wherein the inputs are further comprised of values derived from processing the code word of a balanced code at an earlier time.

29. The apparatus of claim 20, wherein the balanced code is a sparse signaling code.

30. The apparatus of claim 29, wherein sparse signaling code is a ternary sparse signaling code.

31. The apparatus of claim 30, wherein the ternary sparse signaling code is a 4b5w ternary sparse signaling code or a 8b8w ternary sparse signaling code.

32. An apparatus for processing signals corresponding to balanced code signals, comprising:
    a set of controlled sources;
    a set of current sources that sink a predetermined current from circuit nodes associated with each of the controlled sources;
    interconnection of the circuit nodes associated with each of the controlled sources by an impedance;
    inputs to the controlled sources comprised of at least three values representing the code word of a balanced code; and
    an output result derived from the current provided by each controlled source.

33. The apparatus of claim 32, wherein the impedance is resistive.

34. The apparatus of claim 32, wherein the impedance is comprised of resistive and capacitive elements.

35. The apparatus of claim 32, wherein the impedance comprises one or more impedance elements and at least one of the impedance elements is programmable.

36. The apparatus of claim 32, wherein the interconnection is between pairs of the circuit nodes.

37. The apparatus of claim 32, wherein the interconnection is from each of the circuit nodes to a common interconnection node.

* * * * *